United States Patent
Martin (10) Patent No.: US 11,429,829 B2
(45) Date of Patent: Aug. 30, 2022

(54) APPARATUS AND METHOD FOR IMPROVED READING OF RFID TAGS DURING MANUFACTURE

(71) Applicant: Lawrence Joseph Martin, Efland, NC (US)

(72) Inventor: Lawrence Joseph Martin, Efland, NC (US)

( * ) Notice: Subject to any disclaimer, the term of this patent is extended or adjusted under 35 U.S.C. 154(b) by 20 days.

(21) Appl. No.: 17/126,376

(22) Filed: Dec. 18, 2020

(65) Prior Publication Data

US 2022/0198233 A1    Jun. 23, 2022

(51) Int. Cl.
G06K 19/07 (2006.01)
G06K 7/00 (2006.01)
G01R 31/28 (2006.01)
G06K 19/077 (2006.01)

(52) U.S. Cl.
CPC ..... *G06K 19/0723* (2013.01); *G01R 31/2822* (2013.01); *G06K 7/0095* (2013.01); *G06K 19/07718* (2013.01)

(58) Field of Classification Search
CPC ......... G06K 19/0723; G06K 19/07718; G06K 7/0008; G06K 7/0095; G06K 7/10009; G06K 7/10128; G06K 7/10316; G06K 7/10356; G06K 7/10366; G06K 17/00; G01R 31/2822; G06Q 10/08; G06Q 10/087
See application file for complete search history.

(56) References Cited

U.S. PATENT DOCUMENTS

| | | | |
|---|---|---|---|
| 2005/0065861 A1* | 3/2005 | Bann | G06Q 10/087 705/28 |
| 2010/0283584 A1* | 11/2010 | McAllister | B65C 11/006 340/10.1 |
| 2013/0043983 A1* | 2/2013 | Lee | G06K 1/18 340/10.51 |
| 2020/0019738 A1* | 1/2020 | Butler | G06K 7/10198 |
| 2020/0096599 A1* | 3/2020 | Hewett | H04B 1/0007 |
| 2020/0279215 A1* | 9/2020 | Trivelpiece | G06K 7/10386 |

* cited by examiner

*Primary Examiner* — Orlando Bousono (57) ABSTRACT

An Apparatus and Method for reliably sorting RFID chips, in inlays, labels, tags or other units of manufacture, into rows and columns, and using that information to report their exact position on a moving web, in support of further manufacturing processes, in the presence of crosstalk, with speed and accuracy exceeding prior art.

12 Claims, 6 Drawing Sheets

APPARATUS AND METHOD FOR IMPROVED READING OF RFID TAGS DURING MANUFACTURE

CROSS-REFERENCE TO RELATED APPLICATIONS

The application is based upon and claims the benefit of U.S. Pat. No. 7,375,636, "Apparatus and method for real time functional testing of RFID Tags," granted May 20, 2008, to the present inventor; expired Oct. 5, 2020; the entire contents of which are incorporated herein by reference.

The application further is based upon and claims the benefit of U.S. Pat. No. 8,896,425, "Apparatus and Method for Serialized Continuous Encoding of RFID Tags," granted Nov. 5, 2014, to the present inventor; the entire contents of which are incorporated herein by reference.

The application further is based upon and claims the benefit of U.S. Provisional Patent Application 65/952,766, "Apparatus and Method for Multilane Sorting of RFID Tags," filed Dec. 23, 2019, by the present inventor; the entire contents of which are incorporated herein by reference.

The application further is based upon and claims the benefit of U.S. Provisional Patent Application 65/953,237, "Apparatus and Method for Real Time Functional Testing of RFID Tags on Extended Path," filed Dec. 24, 2019, by the present inventor; the entire contents of which are incorporated herein by reference.

FEDERALLY SPONSORED RESEARCH

Not Applicable

SEQUENCE LISTING OR PROGRAM

Not Applicable

BACKGROUND OF THE INVENTION

This invention generally relates to the production of Radio Frequency (RF) Identification Device (RFID) tags, specifically to the reliable testing of finished RFID tags and labels at high speed in a production environment.

BACKGROUND OF THE INVENTION

Prior Art

Radio Frequency Identification (RFID) tags and labels comprise antennas coupled to analog and/or digital electronics, which may include for example communications electronics, data memory, and control logic. Passive RFID devices have no batteries or other power source, instead deriving power only from their antenna. RFID tags and labels are widely used to associate an object with an identification code. For example, RFID tags are used in conjunction with security-locks in cars, for access control to buildings, and for tracking inventory and parcels. Some examples of RFID tags and labels appear in U.S. Pat. No. 6,850,080 (Hiroki 2005), U.S. Pat. No. 6,429,831 (Babb 2002), U.S. Pat. No. 6,940,408 (Ferguson et al. 2005), U.S. Pat. No. 6,784,789 (Eroglu et al. 2004), U.S. Pat. No. 6,535,175 (Brady et al. 2003), U.S. Pat. No. 6,827,817 (Bleckmann et al. 2004), U.S. Pat. No. 6,780,265 (Bleckmann et al. 2004), and U.S. Pat. No. 6,451,154 (Grabau et al. 2002).

Integrated circuit chips are the lowest level of RFID. Each chip holds some amount of data including an identifier, or Chip ID. Each chip is bonded to an antenna to make an RFID inlay. Inlays are assembled ("laid in") to labels, cards, hang tags, and other items to make RFID Tags.

Reading in Manufacture

Like anything else that is manufactured, RFID tags must be tested and configured. The manufacture time configuration of RFID tags is variously known as Commissioning, Deployment, Personalization, or Encoding. All those terms imply the contactless encoding of data to each RFID chip in a manufacturing process. U.S. Pat. No. 8,896,425 (Martin 2014) addresses the difficulty of this process and presents a general solution. The efficacy of that solution is limited by the speed and reliability of reading an identifier from each chip. Said identifiers are generally called Unique ID (UID) or Tag ID (TID), depending on the RFID technology in use. This disclosure will use the term "TID/UID" to denote the RFID Tag or Chip ID.

RFID inlays and labels are typically produced on a continuous, moving web of backing material. Such webs are processed on large, expensive printing presses or other dedicated machinery. In order to maximize profit, RFID producers strive to increase the density of production. For example, a twelve inch wide press that was used in the past to make four inch wide labels in a single lane may now produce three parallel lanes of the original dimension, or even more lanes of smaller dimension. Although most RFID manufacturers use the term "lane" to describe this technique, the following description largely use the term "row" instead, to highlight the geometrical nature of the problem.

As density increases, so does the sensitivity of typical RFID inlays. As economics compel closer spaced inlays, physics increases the electromagnetic interaction between those inlays. With UHF inlays especially, crosstalk among inlays on a web becomes unavoidable.

RFID manufacturing processes also become more complex over time. In the past, each inlay on a single row had to be functionally tested, and marked bad if the functional test failed (Martin 2008). As inlays become more sensitive and manufacturing density increases, it becomes increasingly difficult to determine the position of any particular tag on the moving web. Conversely, for any particular test, uncertainty increases, along with the frequency of bad marks going onto the wrong tags. A good result could be false because a bad inlay coupled to its neighbor. A bad result could be false because two or more good tags interfered and spoiled the result. As manufacturing processes mature towards high speed encoding (Martin 2014), the problems become even more pronounced.

Common Practices

Most RFID test systems integrated with equipment like presses and apply systems find a suitable location for a single RFID antenna, then control that antenna with a single RFID reader. Multi-row systems are implemented by increasing the number of antennas and readers, but almost always one reader per row. The exception to that rule is where one fast RFID reader is multiplexed across multiple rows. The speed of the read test system is therefore limited by the speed of an individual RFID reader.

The most typical industry techniques to combat these stated problems involve improved design of antennas and shielding to ensure communication with one and only one RFID inlay at a time; however, this approach is difficult to maintain on flexible production lines that manufacture a variety of products in differing geometries. Less common techniques involve measurement of signal strength, phase and turnaround time of the inlay's reply. Those measures meet with limited success. For example, it is possible to read a UHF inlay multiple wavelengths away from a test antenna, with the same signal strength, phase and reply time as one atop the same antenna, given unfortunate coincidences of Radio Frequency (RF) reflection and propagation.

The above described phenomena of electromagnetic interaction between inlays on the web, and RF reflection around the web, are referred to collectively as crosstalk. The current Invention accepts crosstalk as inevitable and exploits it in order to achieve certainty in the identification of RFID tags on webs, in support of functional test as well as advanced manufacturing processes.

Another common practice is to use RFID readers that can vary the RF power transmitted to each tag, recording the minimum power that causes each tag to respond, in a technique known as power sweeping. RFID readers that can sweep power are expensive test equipment, and are not economical to scale across multiple lanes. It is common to multiplex expensive readers across multiple physical lanes of product, but that practice limits the throughput of the test system.

The uniting characteristic of all RFID read testing during manufacture before this invention, including (Martin 2008) and (Martin 2014), is that each RFID tag read is a separate event. Historically, one tag passes over one antenna, and it is read, correctly or not, and the result is treated as a fact for reporting and downstream use. The core idea of this invention is to collect data from multiple tag read events and check them against each other before reporting.

BACKGROUND OF THE INVENTION—OBJECTS AND ADVANTAGES

Accordingly, several objects and advantages of this Apparatus and Method for Improved Reading of RFID Tags During Manufacture are the location of RFID inlays on a moving web, at speeds greater than common RFID reading processes, while further:

(a) recording data from a plurality of RFID read operations, (b) using said recorded data to determine the position of RFID tags in two dimensions, (c) correcting false failures via a plurality of mechanisms, (d) detecting false successes via a plurality of mechanisms, (e) reporting on the sequence of items in a batch of said items, including the position and quality of each specific item in the batch, only after all supporting data has been recorded and analyzed, (f) using inexpensive, commodity RFID readers.

Further objects and advantages will become apparent from a consideration of the ensuing description and drawings.

SUMMARY

This Apparatus and Method for Improved Reading of RFID Tags During Manufacture allows use of commercially available RFID readers with specialized near field antennas to determine the location of each RFID inlay, and the location of bad inlays, on any single lane (row) or multilane web, with greater certainty and higher speed than prior art. It approaches the process of reading RFID Tags during manufacture as a sorting problem, collecting data from multiple RFID readers over multiple read events, to properly determine the location of each tag in two dimensions called rows and columns.

DRAWINGS—REFERENCE NUMERALS

1 Continuous Web of RFID Tags
2 Plurality of Near Field RFID Antennas in line with web
3 Plurality of Near Field RFID Antennas for a single row
4 Reported "column" of tags in single row operation
5 Reported column of tags in multiple row operation
6 Software Program
7 Report of RFID Tag ID Sequence and Bad Tags
8 Label Sensor
9 Plurality of Near Field RFID Antennas across web
10 Plurality of RFID Readers for sorting tags into rows
11 Plurality of RFID Readers for sorting tags into columns Reference Numerals 20 and above are processing blocks of Software Program (6), described below.

DETAILED DESCRIPTION

Figure 1:
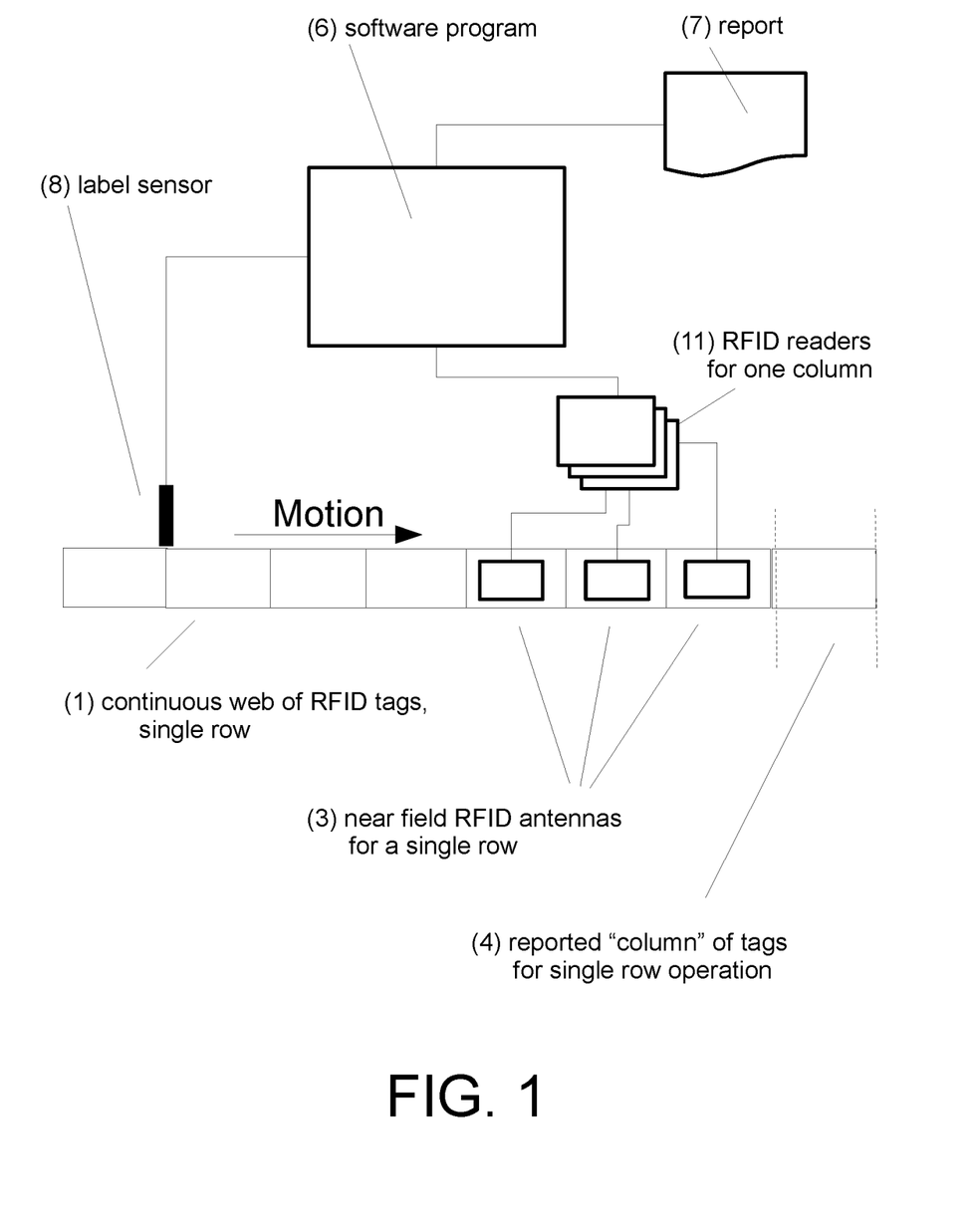
FIG. 1 is the preferred embodiment for one row operation, showing multiple RFID antennas for the single lane (row).

FIG. 1—Preferred Embodiment for Single Lane or Row

In FIG. 1, a continuous web of RFID tags (1) is operated on by a Software Program (6) through a plurality of sensors and actuators. In this and all Figures showing physical apparatus, motion of (1) proceeds from left to right. As said RFID tags run across a plurality of short near field RFID antennas (3), located across the motion of (1), they are read by a plurality of RFID Readers for columns (11). (11) provides a unique ID for each RFID tag on each antenna to (6), to be sorted into columns using algorithms described in greater detail below. In general, the algorithms involve using multiple tag reads on each antenna in (3) to vote on the position on (1) of each tag, or its "column". It is important to note that this invention expects some crosstalk to occur, so any given tag may read on more than one of (3) in any given cycle. It is expected that the pattern of TID/UID occurrence on each of (3) as each tag in (1) passes over (3) will yield the true position of said tag as well as revealing bad spots on (1). Thus the invention tolerates and manages crosstalk in the reading of RFID tags during manufacture.

The process yields an accurate Report (7) of the position of each said RFID tag in one dimension (columns in a single row), and the column position of bad RFID tags, even in the presence of crosstalk, for each tag on said web, one per column. (7) may be embodied as a data stream, or as a computer file, or as a discrete BAD output signal, without changing the sense of the invention.

Said Report (7) can be used as input to further manufacturing processes including high speed encoding (Martin 2014), granting said further processes the benefit of this invention's increased speed and accuracy relative to prior art.

Figure 2:
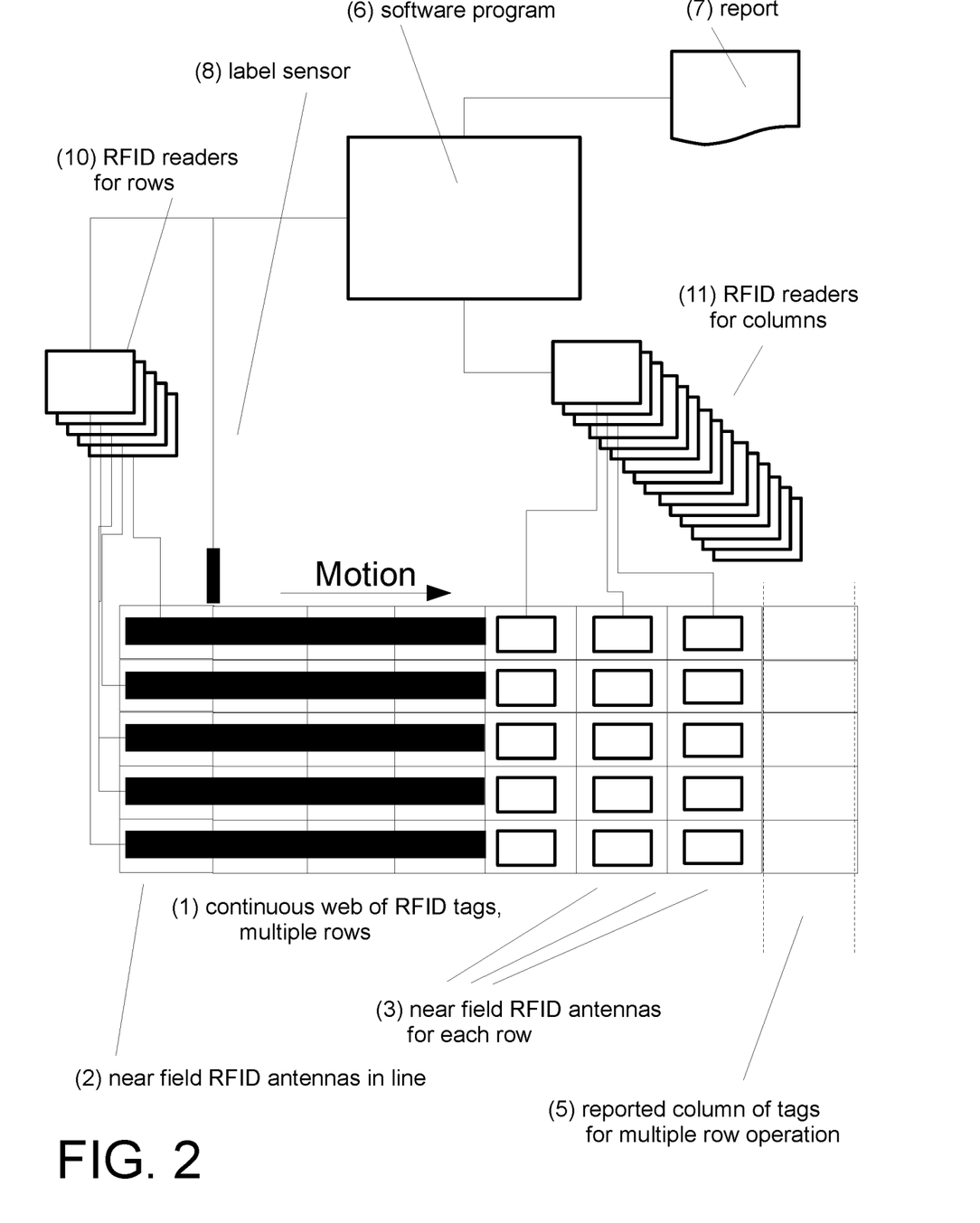
FIG. 2 is the preferred embodiment for multiple lane (row) operation, showing one long RFID antenna for each lane (row) and multiple short RFID antennas for each row.

FIG. 2—Preferred Embodiment for Multiple Lanes or Rows

FIG. 2 introduces multiple rows, making the sorting problem two dimensional. As said RFID tags (1) approach said plurality of short near field RFID antennas (3), for each column, a plurality of long near field RFID antennas (2) engages each tag multiple times through a plurality of RFID readers for sorting tags into rows (10). Said Software Program (6) uses the resulting TID/UID data to determine the row of each tag, through algorithms described in detail below. In general, the frequency of reads on each antenna is used, along with signal strength and other measurements where available, to determine the row location of each tag before it reaches (3). It is important to note that this invention expects some crosstalk to occur, so any given tag will read on more than one of (2) as it approaches (3). It is expected that each tag will read more times, and more strongly, on one of said antennas (2). Thus the invention tolerates and manages crosstalk in the reading of RFID tags during manufacture.

The process yields an accurate Report (7) of the position of each said RFID tag in two dimensions (columns and rows), and the two dimensional position of bad RFID tags, even in the presence of crosstalk, for each tag on said web, one per column, for use as described above.

Figure 3:
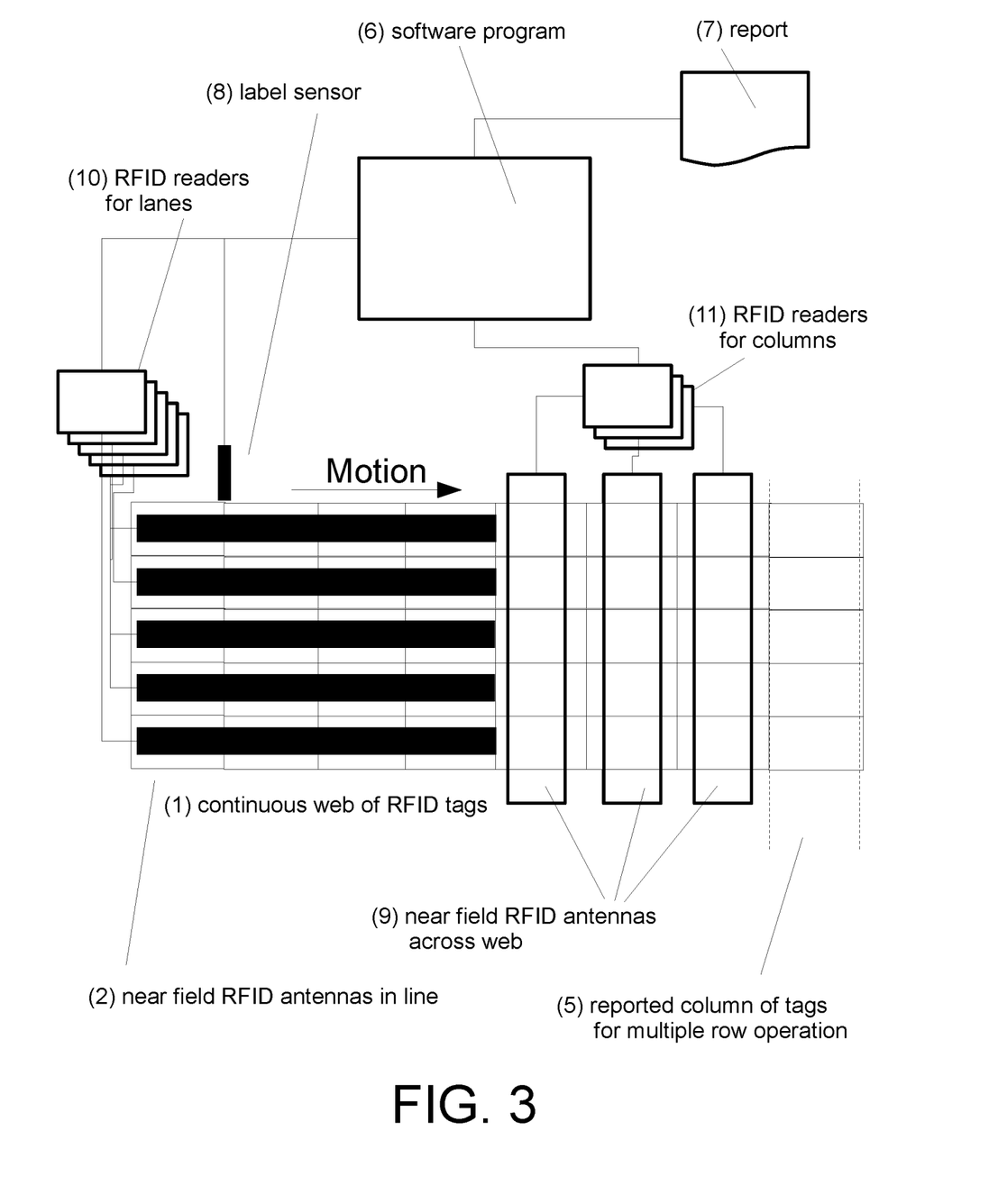
FIG. 3 is an alternate embodiment for multiple lane (row) operation, showing one long RFID antenna for each lane (row) and multiple long RFID antennas across all rows.

FIG. 3—Alternate Embodiment Saving Hardware

FIG. 3 addresses a complexity of the pluralities of antennas (3) and RFID readers (11) in FIG. 2; namely, that said components proliferate rapidly as lanes are added to the system. In FIG. 3, a large plurality of short antennas (3) is replaced by a smaller Plurality of longer Near Field RFID Antennas (9). Each antenna of (9) reaches across the web, engaging all the tags in one column. In this embodiment, (6) will independently sort the individual tags of (1) into rows using (2) and (10), then into columns using (9) and (11). The combination of the two sorts will yield a two dimensional sort of said tags into their proper position on (1).

Regarding the length of (3) as opposed to (9), shorter antennas engage fewer rows in one read. FIGS. 1 and 2 show each plurality of antennas (3) engaging a single row of tags on (1). FIG. 3 shows a single plurality of antennas (9) engaging all rows of (1). The member antennas of (3) are sized to interact with one and only one RFID tag at a time. The member antennas of (9) are sized to interact with multiple RFID tags at a time. In both cases, software program (6) compensates for crosstalk in slightly different ways, to determine the location of each TID/UID value on web (1).

Figure 4:
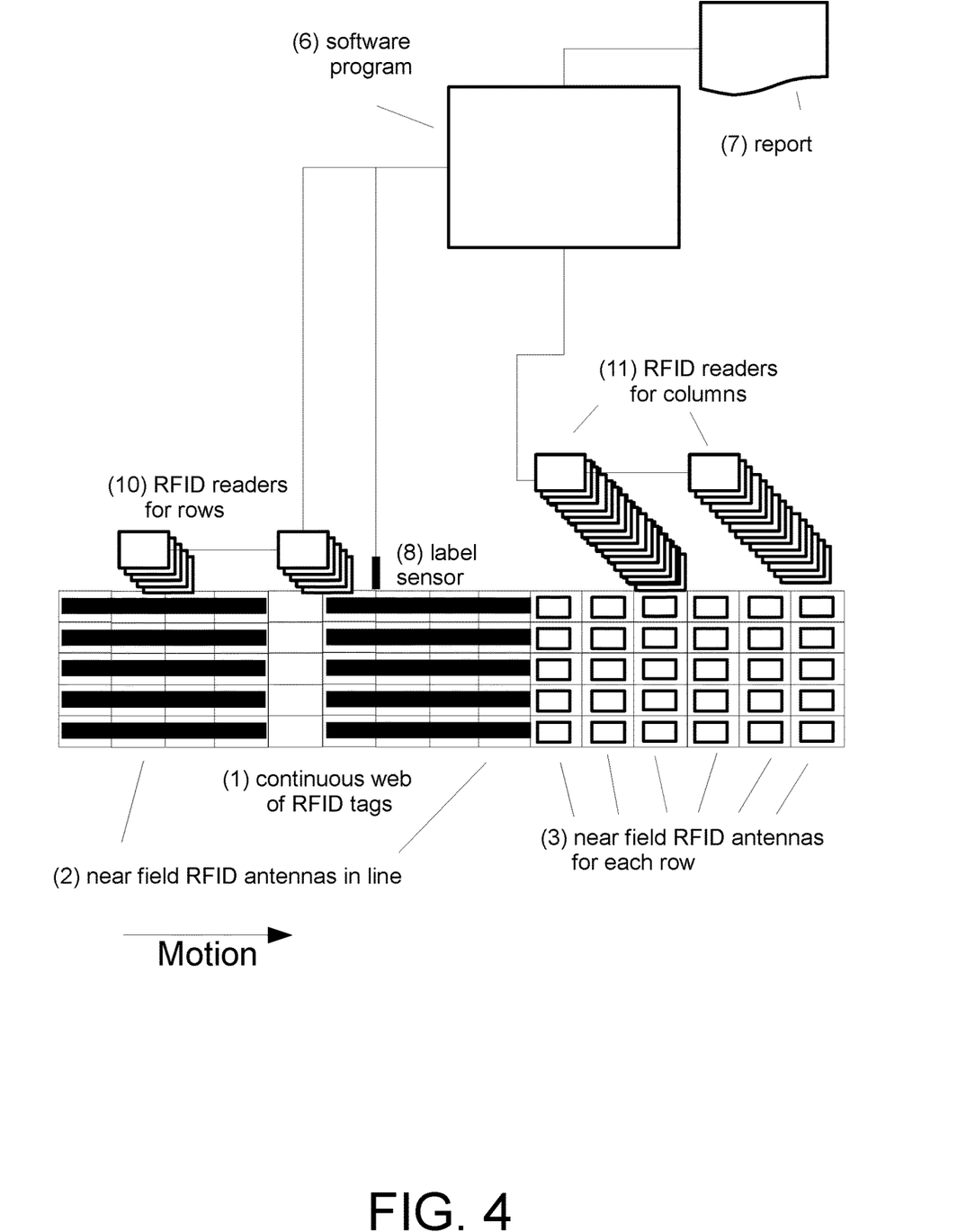
FIG. 4 is an alternate embodiment for multiple lane (row) operation, showing two sets each of row and column antennas, assuming that the upstream set runs at a lower power than the downstream set, as a way to establish performance parameters of RFID tags.

FIG. 4—Alternate Embodiment Measuring Performance

FIG. 4 shows an alternate embodiment with multiple pluralities of (2) and (10) operating in line along (1), which can be called "stages." In this embodiment, the additional stage can be used for redundancy, or operated at a different setting than the original stage. Since RFID read events on all antennas are tracked by (6), the fact that any given RFID tag reads on the additional antenna can be used to establish a record of its operating characteristics. It is common practice to use high end test equipment to read each RFID tag on a web multiple times at various power settings from low to high, and record the power at which the tag starts to communicate. This invention can develop the same information using multiple inexpensive RFID readers, by repeated reads on multiple antennas with different settings, establishing a gradient of the parameter under test, and reporting the first activation of each tag within that gradient. RFID parameters that would be testable using the gradient capability of this invention include, but are not limited to, power, modulation depth, and communication speed.

Said multiple pluralities (11) and (3) can likewise be divided into subsets for redundancy or performance measurement, in whatever patterns can be made that work for any particular embodiment.

FIG. 4—Alternate Embodiment Managing Crosstalk

A further advantage of multiple stages is that operation may be staggered among subsets of (10) and (2), thus reducing the crosstalk to be filtered out by (6). Considering all antennas (2) in FIG. 4, numbering rows from the top, one Label Count cycle could execute on the subset of antennas 1-left, 2-right, 3-left, 4-right and 5-left. The next Label Count cycle could execute on the subset of antennas 1-right, 2-left, 3-right, 4-left and 5-right. For any cycle, the unused antennas could be unpowered, or powered with a carrier signal that reduces crosstalk between the active antennas. The latter technique, commonly known as "jamming," in the radio industry, has been unused in RFID before this invention.

Said multiple pluralities (11) and (3) can likewise be divided into subsets for crosstalk management, in whatever patterns can be made that work for any particular embodiment.

FIG. 4—Alternate Embodiment Maximizing Throughput

Said multiple pluralities (3) or (9), in combination with (11), can be arranged to increase the throughput of the system. One way to embody this would be to have four antennas in a row of (3), rather than the three shown. Antennas 0 and 2 would be activated on even Label Count cycles (24) and antennas 1 and 3 would be activated on odd cycles of (24). However, each read operation would be extended into the next label cycle, giving each reader two cycles of (24) to read a TID/UID value, thus allowing the system to read tags when the physical pace of (1) is faster than the minimum time required to read an RFID tag. This approach could scale until a physical limit is reached, probably when interaction between RFID readers goes beyond crosstalk into interference.

Figure 5:
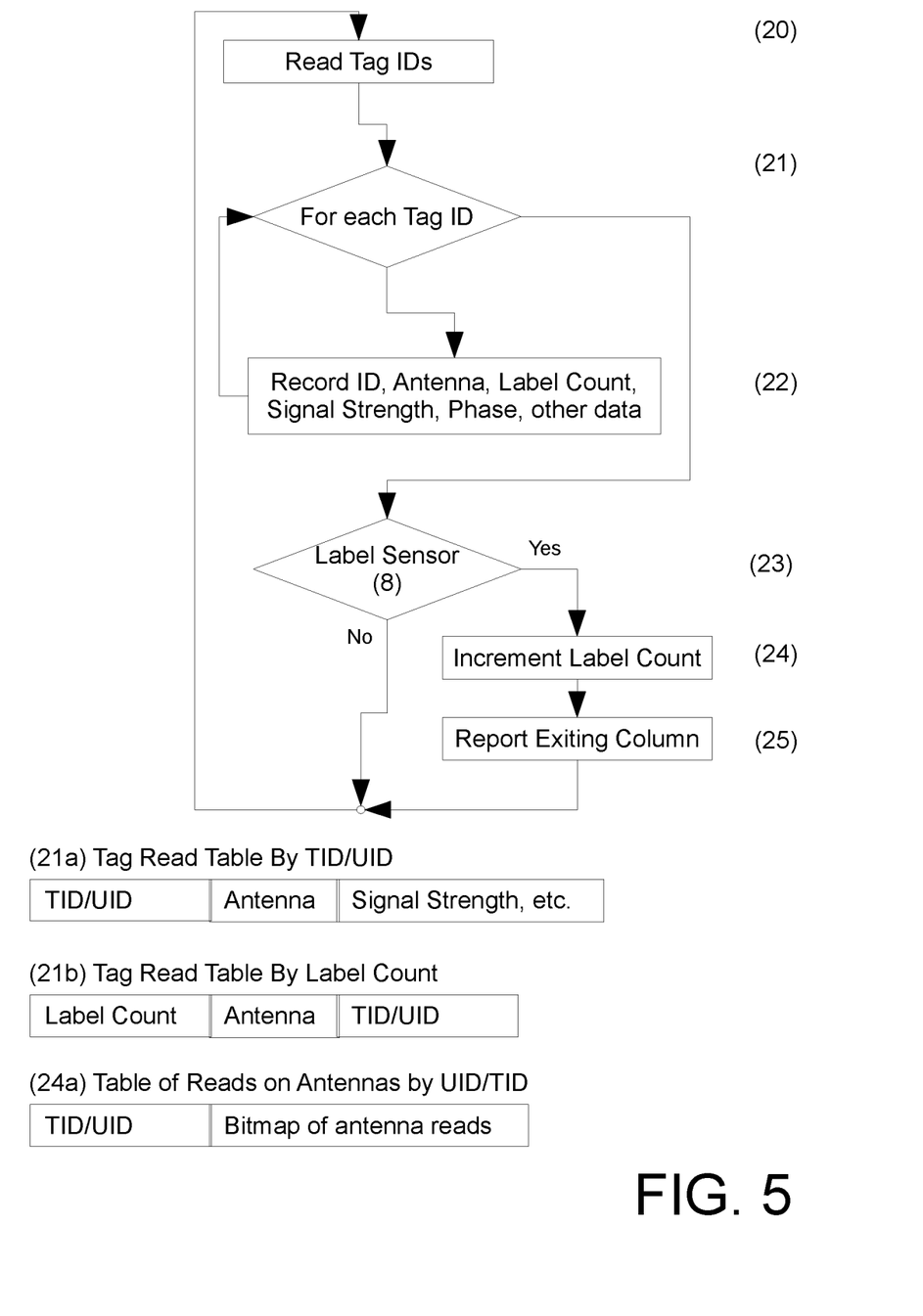
FIG. 5 is a partial flowchart of the software program, showing the state machine for sampling tag IDs on one antenna.
Figure 6:
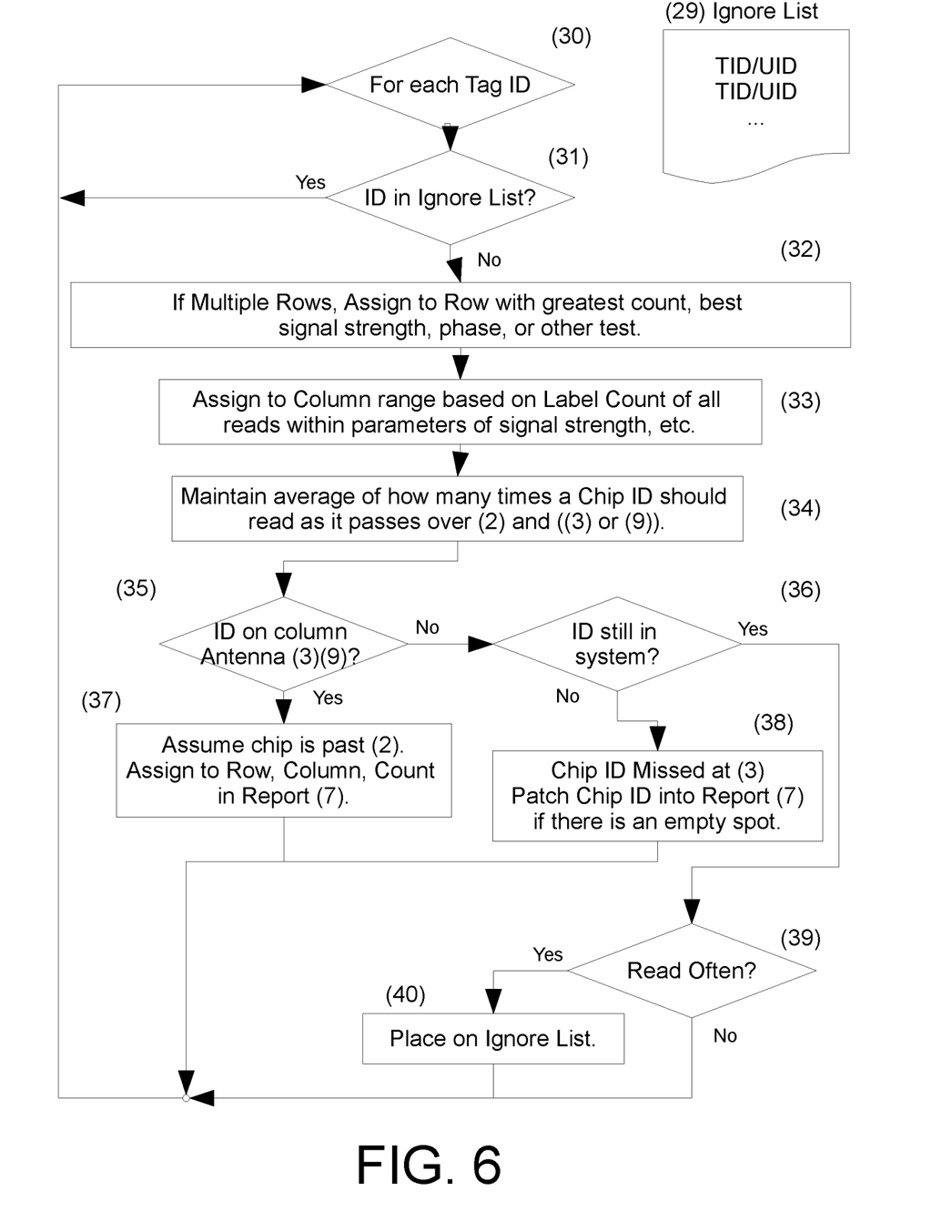
FIG. 6 is a partial flowchart of the software program, showing the process for sorting RFID Tags into rows and columns.

FIGS. 5,6—Software Program

Said Software Program (6) may execute on Personal Computer (PC), Programmable Logic Controller (PLC) or any other computing device. The key to the current invention is in the processing performed by (6), shown in FIGS. 5-6, in any specific embodiment.

Said Software Program (6) is implemented in parallel state machines, all sharing a Label Count, defined as the current count of signals from a Label Sensor (8) or from some control mechanism on a host machine, outside the scope of this invention. FIG. 5 presents the state machine that establishes the read history of one antenna. In (20), said Software Program (6) reads all available tag IDs on one of said pluralities of near field RFID antennas (2)(3)(9). In (21), (6) loops through all tag IDs found. In (22), (6) records detecting a tag ID on the current antenna, along with the current Label Count. In (23), (6) checks Label Sensor (8). In (24), (6) updates said Label Count if (8) has signaled a new label. Label Count (24) is global to the entire invention and coordinates events. (8) may be replaced with an appropriate control signal from outside the system without altering the sense of this invention.

At the bottom of FIG. 5, a plurality of data structures (21a), (21b), and (24a) is shown. Said data structures are meant to optimize the processing in FIG. 6. Ideally, (6) would be fast enough to loop through all data recorded in FIG. 6 between signals from (8), that is, without falling behind the pace of the physical process. In practice, processing in that manner implies the use of nested loops, which increase processing power exponentially as the data volume increases. This concept is described in computer science as "Big-O," where a doubly nested loop creates Big-O behavior of N-squared, a triply nested loop creates Big-O of N cubed, and so on. Said data structures (21a), (22b), and (24a) reduce the Big-O of (6) to N, where processing time increases in a linear manner relative to data size N. (21a) and (24a) accomplish this by investing processing time in steps (21) and (24) to prepare data for processing in FIG. 6, which would otherwise have to be developed in nested loops. Specifically, for each Tag ID processed in (21), table (21a) is updated with read events indexed by TID/UID, tracking each read by antenna, and recording the signal strength and any other available metrics for that TID/UID on that Antenna. In the same step (21), table (21b) is updated with read events indexed by the current Label Count, recording the Antenna and TID/UID of each read. Finally, in the same step (21), table (24a) is updated to show that a tag was read in the current Label Count.

In each Label Count Increment step (24), table (24a) is updated to allow a new set of reads to be recorded. One implementation that would work well on most microprocessors, in a system with 4 antennas, would be to allocate a 32 bit variable for each TID/UID value. In each step (24), the 32 bit value would be shifted left 4 places, providing room for a read to be recorded on any or all of the 4 antennas before the next change of Label Count. The history of read events on each antenna for each TID/UID is therefore testable in (6) by common arithmetic instructions rather than database lookups or other looping techniques.

FIG. 6 presents an algorithm for determining position of each inlay on web (1), given data collected in FIG. 5.

The top of FIG. 6 shows an Ignore List (29), which is a list of TID/UID values that are read too often and therefore left out of further computations. Tags on the Ignore List may be lying on antennas or cables after separating from web (1), or may be in the vicinity waiting to be added to or removed from the manufacturing process. TID/UID values are placed on (29) according to criteria described below.

Step (30) is the top of a loop that considers each TID/UID on a given antenna. Step (30) and other steps in FIG. 6 can execute as part of step (22) of FIG. 4, or as part of an independent process, or on a different Central Processing Unit (CPU), without altering the sense of this invention.

In step (31), a single TID/UID value from (30) is checked against said Ignore List (29). FIG. 6 shows any TID/UID on (29) being ignored. In practice, the reading of a tag on (29) may be a reportable event, and various obvious means may be employed to manage the contents of (29), without changing the sense of this invention.

Step (32) applies only to embodiments with multiple logical rows corresponding to physical lanes. As RFID tags in (1) are read multiple times by said pluralities (2) and (10), and recorded in (21a), (21b), and (24a), information will be developed concerning the row position of each tag. Ideally, each tag of (1) will read on one and only one antenna of (2), with no crosstalk, and be assigned to that row; however, in practice, crosstalk may cause any RFID tag in (1) to read on multiple antennas of (2). Ideally, reads of any tag of (1) on multiple antennas (2) would differ by signal strength or frequency, such that (32) could assign each tag to the row with the most or the strongest reads, thereby easily mitigating crosstalk; however, in practice, any tag of (1) may appear identically on two or more antennas. Any of a number of methods may be employed to resolve such conflicts, within the scope of this invention:

a. (32) may count tags currently assigned to rows and decide in favor of a row with fewer tags assigned than its neighbors, b. (32) may work with the historical pattern of tag reads on antennas stored in (21a), (21b) and (24a) in order to generate a vote value, tag by tag for each antenna, deciding in favor of the tag with the greatest vote value for a given antenna, c. (32) may defer a row assignment until step (33), when the tag in conflict is read by (3) and (11), d. (32) may monitor (33) and use any changed row assignments to modify its own voting criteria, e. (32) may employ neural net based learning or other Artificial Intelligence (AI) technique to resolve conflicted tag reads, f. (32) may employ a confidence variable for each of its determinations, roughly analogous to said vote value, and consider low confidence assignments for change before final reporting if better information develops, g. (32) may simply call any tag bad that cannot be assigned to a row with high confidence.

In the alternate embodiment of FIG. 3, (32) must assign each tag of (1) to its correct row before that tag reaches said plurality of long column antennas (9), because (9) cannot distinguish RFID reads by row.

Step (33) applies to RFID tag reads on (3) and (11), or on (9). In (33), tags of (1) are assigned to columns of (1). Stated another way, the actual position of tags on (1) is finalized in (33). Considering a single row of tags on (1), ideally, each tag would read on each antenna of (3) or (9) in consecutive Label Count cycles, and be assigned to the corresponding column with high confidence. In practice, variables of speed, spacing, and crosstalk will combine to make RFID tags read on only some of (3) or (9), and (21a), (21b) and (24a) will contain conflicting information. The computational techniques described for step (32) will be needed in (33) in order to resolve such conflicts.

Step (33) has the additional function of determining bad spots in (1), where no functioning RFID tag is present. It will often happen that no RFID tag can be assigned to a given column position with high confidence before the column exits (3) or (9). That column is a bad spot in (1) at reporting location (4) or (5). A later step (38) will allow unassigned tags to be patched into the final report if possible with high confidence.

Step (34) maintains statistics of how many times a tag of (1) may be expected to read as it traverses the system. Said statistics are used in step (39) below.

Step (35) tests the progress of the current TID/UID through the system. If the current TID/UID has been read on (3) or (9) within the last few Label Count cycles (24), then step (37) is executed, refining the tag's column position on (1). If (2) is present, row position is determined in (37).

Step (36) makes the final determination of the content of each column. If a TID/UID has been read on (3) or (9), but has not been read for some number of Label Count cycles (24), and has not been assigned a column position on (1), (36) passes control to step (38). (38) can look for an unassigned column on (1). Said unassigned column is represented by a single column on (4) and (5), but in practice, (38) can adjust more than one downstream column before the final report (7) is made on the column.

If the current TID/UID has been read on (3) or (9) within the last few Label Count cycles (24), (36) passes control to step (39). (39) compares a count of reads of the current TID/UID to said average value maintained by (34). If said count of reads exceeds (34) by some embodiment specific threshold or multiple, the current TID/UID may be placed on Ignore List (29) by step (40).

FIG. 6 executes continuously, constantly evaluating the history saved in (21a), (21b), and (24a), refining the invention's determination of the row and column position of each tag on (1), adding data to said final report (7), column by column, as columns of tags exit the physical test zone at (4) or (5).

I claim:

1. A method of determining a position of each member of a plurality of passive radio frequency identification (RFID) tags, on a moving web, in motion through an RFID manufacturing process, comprising:
    a. providing a plurality of RFID readers, each of said plurality of RFID readers coupled to one of a plurality of RFID antennas, performing a plurality of RFID tag read operations on said plurality of RFID tags in response to a plurality of trigger events from a sensor or an external control system,
    b. recording a plurality of RFID data from said plurality of RFID tag read operations,
    c. using a software algorithm to derive a pattern from said plurality of RFID data to determine a position of each of said plurality of RFID tags relative to each of said plurality of RFID antennas, including a plurality of positions that should hold one of said plurality of RFID tags, but in which position none of said plurality of RFID tags may be fixed, thus generating a list of bad RFID tag positions,
    d. generating an RFID tag position report for use in a further manufacturing process.

2. The method of claim 1, in which said software algorithm uses a voting technique to improve accuracy of said tag position report.

3. The method of claim 1, in which said software algorithm uses a neural network or other artificial intelligence technology to improve accuracy of said tag position report.

4. The method of claim 1, in which said software algorithm maintains a list of RFID tag ID numbers that satisfy a plurality of criteria for rejection from said tag position report, removing RFID tags on said list of RFID tag ID numbers from said tag position report.

5. The method of claim 1, in which a gradient of power or other variable parameter is established among several of said plurality of RFID antennas encountered by each individual RFID tag of said plurality of RFID tags, characterizing the performance of each said individual RFID tag of said plurality of RFID tags relative to said gradient of power or variable parameter.

6. The method of claim 1, in which said plurality of RFID antennas are activated in a plurality of patterns, meant to manage crosstalk between said plurality of RFID tags.

7. The method of claim 1, in which said plurality of RFID antennas are activated in a plurality of patterns meant to increase throughput of the claimed method.

8. The method of claim 1, in which a continuous carrier signal is coupled into a subset of said plurality of RFID antennas, in a plurality of patterns, meant to manage crosstalk between said plurality of RFID tags.

9. The method of claim 1, in which said tag position report is a human readable realtime display.

10. The method of claim 1, in which said tag position report is a file in a digital data processing system.

11. The method of claim 1, in which said tag position report is a discrete digital signal to a bad tag marker, or a removal apparatus, or a remove/replace apparatus, or other external manufacturing process driven by said discrete digital signal.

12. The method of claim 1, in which said tag position report is a communication channel to a data driven manufacturing process.

* * * * *